United States Patent [19]

Rolfson et al.

[11] Patent Number: 5,194,346

[45] Date of Patent: Mar. 16, 1993

[54] METHOD OF FABRICATING PHASE SHIFTING RETICLES WITH AN ACCURATE PHASE SHIFT LAYER

[75] Inventors: J. Brett Rolfson; David A. Cathey, Jr., both of Boise, Id.

[73] Assignee: Micron Technology, Inc., Boise, Id.

[21] Appl. No.: 687,036

[22] Filed: Apr. 15, 1991

[51] Int. Cl.$^5$ .............................................. G03F 9/00
[52] U.S. Cl. ......................................... 430/5; 430/22; 430/269; 430/311; 430/396
[58] Field of Search ..................... 430/5, 22, 269, 311, 430/396

[56] References Cited

U.S. PATENT DOCUMENTS

| | | | |
|---|---|---|---|
| 3,604,778 | 9/1971 | Burckhardt | 350/3.5 |
| 4,360,586 | 11/1982 | Flanders et al. | 430/321 |
| 4,755,415 | 7/1988 | Iijima et al. | 428/163 |
| 4,902,899 | 2/1990 | Lin et al. | 250/492.1 |

OTHER PUBLICATIONS

Durnin, et al., "Diffraction-Free Beams" Physical Review Letters, vol. 58(Apr. 13, 1987), p. 1499.
Yamanaka, et al., "A 5.9 μm² Super Low Power SRAM Cell Using a New Phase-Shift Lithography" IEDM 90 (Apr., 1990), p. 477.
Watanabe, et al., "Transparent Phase Shifting Mask", IEDM 90 (Apr., 1990), p. 821.
Terasawa, et al., "0.3-micron optical lithography using a phase-shifting mask", SPIE vol. 1088 Optical/Laser Microlithography II (1989), p. 25.
Nitayama, et al., "New Phase Shifting Mask with Self-aligned Phase Shifters for a Quarter Micron Photolithograph", IEDM 89 (Jul., 1989), p. 57.
Levenson, et al., "The Phase-Shifting Mask II: Imaging Simulations and Submicrometer Resist Exposures", IEEE Transactions on Electron Devices, vol. ED-31, No. 6 (Jun., 1984), p. 753.
Lin, Burn J., "Phase Shifting and Other Challenges in Optical Mask Technology", IBM-EF-15 (Sep. 26, 1990).
Hanyu, et al., "New phase-shifting mask with highly transparent SiO₂ phase shifters", SPIE vol. 1264 Optical/Laser Microlithography III (1990), p. 167.
Pfau, et al., "Expoloration of fabrication techniques for phase shifting masks", Semiconductor Research Corporation (Sep. 11, 1990).
Neureuther, Andrew R., "Modeling Phase Shifting Masks", BASCUS Symposium (Sep. 26, 1990).
Fukuda, et al., "Phase-Shifting Mask and FLEX method for Advanced Photolithography", SPIE vol. 1264 Optical/Laser Microlithography III (1990), p. 14.
"LSI Process Lithography, Reticle, Stepper, DRAM", Nikkei Microdevice (Jul., 1990).
"64 M", Nikkei Microdevice (Jul., 1990).

(List continued on next page.)

Primary Examiner—Marion E. McCamish
Assistant Examiner—S. Rosasco
Attorney, Agent, or Firm—Stephen A. Gratton

[57] ABSTRACT

A method of fabricating phase shifting reticles that can be used as a mask in photolithographic processes such as semiconductor wafer patterning. An opaque film such as chromium is first deposited on a transparent substrate. The opaque film is then patterned with openings by a first photolithographic process. A phase shifter material such as (SiO₂) is then blanket deposited into the openings and over the opaque film. The phase shifter material is then polished by chemical mechanical planarization (CMP) to a thickness "T" which is selected to produce a 180° phase shift. The phase shifter material is then photopatterned and selectively etched by a second photolithographic process to remove all of the phase shifter material except in every other opening formed in the opaque film. This forms a repetitive pattern of alternating phase shifters and light transmission openings through the opaque film.

16 Claims, 2 Drawing Sheets

OTHER PUBLICATIONS

Ku, et al., "Use of a π-Phase-Shifting X-Ray mask to Increase the Intensity Slope at Feature Edges", Semiconductor Research Corporation (Jun. 23, 1987).

Nakagawa, et al., "Fabrication of 64M DRAM with i-Line Phase-Shift Lithography", IEDM 90 (Apr., 1990), p. 817.

Levenson, Marc D., "What IS a Phase-Shifting Mask", IBM Research Report (Aug. 15, 1990).

Prouty, et al., "Optical Imaging with Phase Shift Masks", Technology Transfer #90080327A-MIN, p. 41.

"Second Phase Shift Mask Workshop", Japanese Patent Applications, SEMA-TECH, Technology Transfer #90100345A-MIN, p. 159.

Levenson, et al., "Improving Resolution in Photolithography with a Phase-Shifting Mask", IEEE Transactions on Electron Devices, vol. ED-29, No. 12 (Dec., 1982), p. 1828.

Terasawa, et al., "Improved resolution of an i-line stepper using a phase-shifting mask", J. Vac. Sci. Technol. B., vol. 8, No. 6 (Nov./Dec., 1990), p. 1300.

Jinbo, et al., "0.2 μm or Less i-Line lithography by Phase-Shifting-Mask Technology", IEDM 90 (Apr., 1990), p. 825.

METHOD OF FABRICATING PHASE SHIFTING RETICLES WITH AN ACCURATE PHASE SHIFT LAYER

FIELD OF THE INVENTION

This invention relates to semiconductor manufacture and more particularly to a novel process particularly suited to fabricating phase shifting reticles or masks that can be used in fine-line photolithography and having an accurate phase shift layer.

BACKGROUND OF THE INVENTION

As semiconductor manufacturing advances to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

The requirement of small feature sizes with close spacing between adjacent features requires high resolution photolithographic processes. In general, photolithography utilizes a beam of light, such as U.V. waves, to transfer a pattern from a photolithographic mask onto a photoresist coating through an imaging lens. The mask includes opaque and transparent parent regions such that the shapes match those of the openings in the resist coating in the desired or predetermined pattern.

One technique currently being investigated for improving the resolution of the photolithographic process is known as phase shift lithography. With phase shift lithography the interference of light rays is used to overcome diffraction and improve the resolution and depth of optical images projected onto a target. In phase shift lithography, the phase of an exposure light at the object is controlled such that adjacent bright areas are formed preferably 180° out of phase with one another. Dark regions are thus produced between the bright areas by destructive interference even when diffraction would otherwise cause these areas to be lit. This technique improves total resolution at the object and allows resolutions as fine as .15 μm to occur.

An early patent in this field, U.S. Pat. No. 4,360,586 to Flanders et al. was issued on Nov. 23, 1982 and assigned to MIT. This patent was directed to exposing periodic optical features on an object surface. The features were characterized by a spatial period p. According to the invention, a source of radiant energy of wavelength λ illuminates a surface to be exposed through a mask having a spatial period separated from the surface by a distance approximately $S_n = p^2/n\lambda$, where n is an integer greater than one.

With respect to semiconductor fabrication numerous laboratory techniques have been proposed to employ phase shifting in the photopatterning of semiconductor wafers. Most of the work in this area has centered around either "Alternating Phase Shifting", "Subresolution Phase Shifting", or "Rim Phase Shifting" experiments. In general, in each of these techniques a phase shift mask or reticle is constructed in repetitive patterns of three distinct layers of material. An opaque layer on the mask provides areas that allow no light transmission therethrough, a transparent layer provides areas which allow close to 100% of light to pass through and a phase shifter layer provides areas which allow close to 100% of light to pass through but phase shifted 180° from the light passing through the transparent areas. The transparent areas and phase shifting areas are situated such that light rays diffracted through each area is canceled out in a darkened area therebetween. This creates the pattern of dark and bright areas which can be used to clearly delineate features of a pattern on a photopatterned wafer.

"Alternating Phase Shifting" as disclosed in [1] is a spatial frequency reduction concept similar to the method disclosed in the Flanders et al. patent. It is characterized by a pattern of features alternately covered by a phase shifting layer. "Subresolution Phase Shifting" [2] promotes edge intensity cut off by placing a subresolution feature adjacent to a primary image and covering it with a phase shifting layer. "Rim Phase Shifting" [3] overhangs a phase shifter over a chrome mask pattern.

In general, these phase shifting techniques have not been adapted to large scale semiconductor manufacturing processes. One problem with applying phase shifting lithography into practical use, in manufacturing semiconductors, is the difficulty in reticle mask making, inspection, and repair. The process must be compatible with manufacturing conditions, (i.e. inexpensive, repetitive, clean) and prior art laboratory techniques have not heretofore met these criteria.

A representative state of the art semiconductor laboratory process for making a phase shift mask or reticle is disclosed in reference [4]. This process was also generally disclosed in the Flanders et al. patent. This process is shown in FIGS. 1A-1C and is termed a "lift off process".

The "lift off process" may be used to fabricate a reticle on hard copy of an individual drawing for a semiconductor circuit layout. The reticle may then be used directly as a mask in the photopatterning process or may be used to produce a photomask. As an example, this reticle may be used to pattern a wafer surface in a stepped pattern transfer. DRAM's and SRAM's because of their repetitive nature are adapted to manufacture in this manner.

Referring to FIG. 1A, with the "lift off process" a transparent quartz substrate 10 has a film of an opaque material such as chromium (CR) patterned thereon. The chromium (CR) may be deposited and patterned onto the substrate 10 by a conventional process such as electron beam deposition and photolithography. In the example of FIG. 1A, the pattern is a periodic arrangement of chromium (CR) light blockers 12 and spaces 14 patterned on the quartz substrate 10.

A layer of resist 16 is then deposited and patterned over the patterned chromium (CR) light blockers 12 and spaces 14. Every other space 14 is covered with resist 16 such that an alternating pattern of phase shifters and openings will be ultimately formed. As shown in FIG. 1B the resist 16 is patterned in a straight wall profiles such that a subsequent etching process aids the "lift off" step.

With reference to figure 1B, after deposition of the resist 16, a film of phase shifter material such as (SiO$_2$) is blanket deposited over the photoresist 16 and patterned openings 14. The phase shift ultimately obtained is a function of the thickness and refractive index of this phase shifter material, which are preferably selected to provide a 180° phase shift.

As shown in FIG. 1(C) the phase shifter material (SiO$_2$) is then "lifted off" with the remaining layer of photoresist 16 by stripping or etching away the photoresist 16. This leaves a phase shifter 18 in every other opening 14 between the chromium (CR) light blockers 12. This provides an alternating phase shifting pattern as previously explained.

A problem with this "lift off process" is that it is a defect prone, inconsistent, messy procedure not suitable for large scale manufacturing. Large chunks of (SiO$_2$) material are lifted by the etching process and are difficult to remove from the finished reticle. These contaminants may cause subsequent patterning errors of the finished wafer. Another problem with the "lift off process" is that it is difficult to accurately control the thickness of the phase shifters 18.

In the finished reticle each phase shifter 18 preferably has a thickness "T" (FIG. 1C) that produces a 180° phase shift for light passing therethrough. This optimal thickness can be determined by the formula $$T = \frac{i\lambda}{2(n-1)}$$

where
 T = thickness of phase shift material
 i = an odd integer
 λ = wavelength of exposure light
 n = refractive index of phase shifter material at the exposure wavelength Any deviation from this optimal thickness adversely affects the phase shift ultimately obtained. An "edge effect" may occur, for example, at the edge of a phase shifter 18 deposited over the edge of a chromium (CR) light blocker 12. This may be due to the conformal deposition of the phase shifter material over the chromium (CR) light blocker 12 which causes the phase shifter to be slightly thicker at the edges.

This edge effect phenomena is illustrated in FIG. 1D. As shown, the phase shifter 18 has a thickness A that extends past the edge of the chromium light blocker 12 a distance W. For a conformal phase shifter deposition, it is apparent that A is greater than T. The value of A in fact approaches T+H (H being the height of the chromium light blocker 12). The thickness of the phase shifter 18 thus varies from A to T. This variance in the thickness of the phase shifter 18 may introduce undesirable interferences which lead to a degraded image.

The process of the present invention is directed to a novel process that overcomes these prior art limitations. The process of the invention provides a clean, repetitive, technique for forming phase shifting reticles suitable for large scale semiconductor manufacturing. Phase shifters formed in accordance with the invention have an accurate phase shift layer. Moreover the process of the invention can be used to provide phase shifters having a smooth and optically flawless surface.

SUMMARY OF THE INVENTION

In accordance with the present invention a novel method of fabricating phase shift reticles for semiconductor photolithography having an accurate phase shift layer is provided.

The method, in general, includes the steps of:
 depositing an opaque film on a transparent substrate;
 forming a pattern of openings through the opaque film to the substrate by a first photolithographic process;
 depositing a layer of a phase shifter material upon the opaque film and into the openings;
 polishing the phase shifter material to an accurate thickness "T" selected to achieve a 180° phase shift; and
 patterning the layer of phase shifter material with resist and selectively etching the phase shifter material to provide a phase shifter in every other opening previously formed in the opaque film by the first photolithographic process.

This method forms an alternating pattern of phase shifters and light transmission openings having opaque light blockers on either side. The phase shifters are accurately formed to the exact thickness "T" and have a smooth and optically flawless surface.

In use as a reticle, during photopatterning of a wafer, incident light is directed through the quartz substrate. Light passing through a phase shifter is diffracted in an opposite (180°) optical phase from light passing through an adjacent light transmission opening. This phase canceling produces a dark region formed on the target object (wafer) between the adjacent light transmission opening and phase shifter to increase the contrast and depth of the projected image.

Numerous other features, objects, and advantages of the invention will become apparent from the following specification when read in connection with the accompanying drawing in which:

DETAILED DESCRIPTION OF PREFERRED EMBODIMENTS

Referring now to FIGS. 2A-2H a method of fabricating a phase shift reticle having an accurate phase shift layer in accordance with the invention is shown.

Figure 1A:
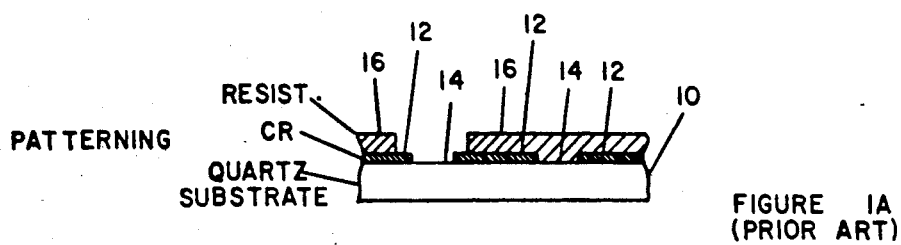
FIGS. 1A-1C are diagrammatic representations of the steps involved in a prior art "lift off" process for forming a phase shift reticle.
Figure 1B:
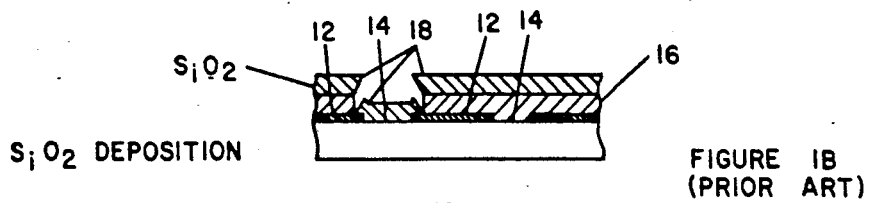
Figure 1C:
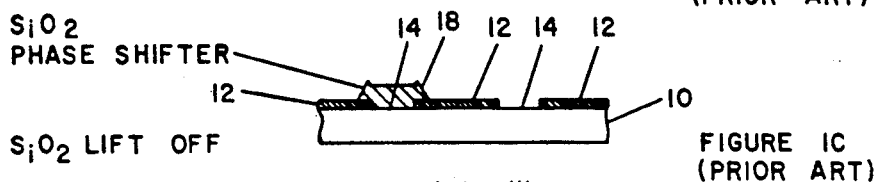
Figure 1D:
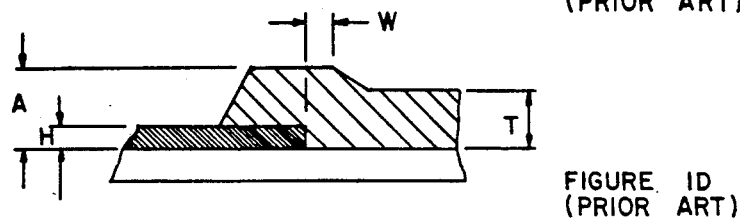
FIG. 1D is an enlarged diagrammatic representation showing the increased thickness of a phase shifter formed in accordance with the a prior art process at an edge of the phase shifter to illustrate an edge effect.
Figure 2A:
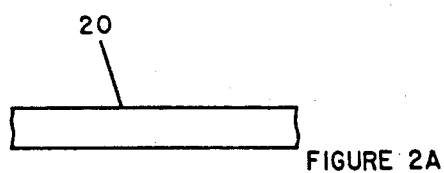
FIGS. 2A-2H are diagrammatic representations of the steps involved in fabricating a phase shift reticle in accordance with the invention.
Figure 2B:
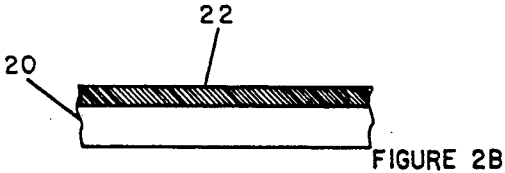
Figure 2C:
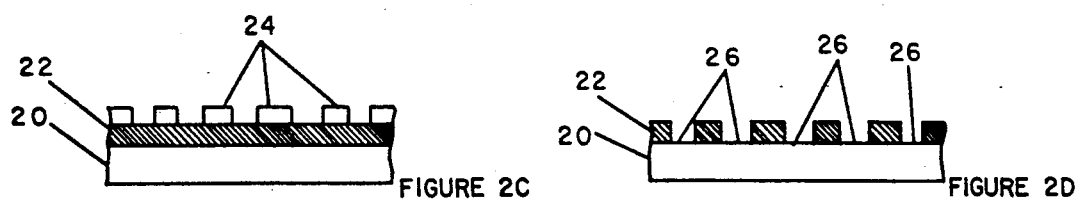
Figure 2D:
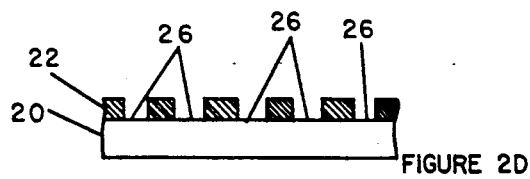
Figure 2E:
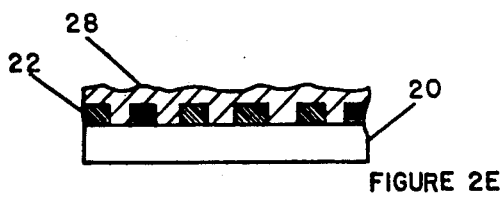
Figure 2F:
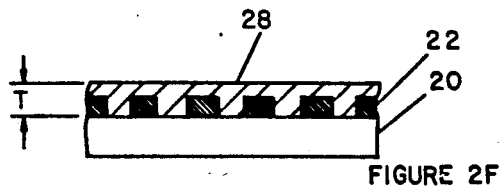
Figure 2G:
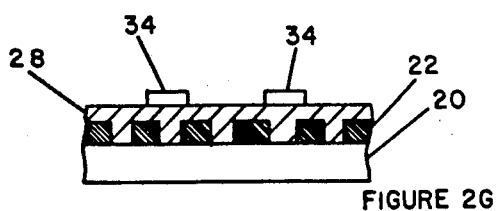
Figure 2H:
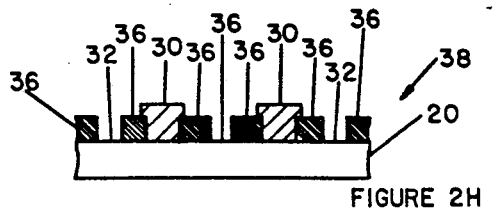

The method of the invention includes the steps of:
 depositing an opaque film on a transparent substrate (FIGS. 2A,2B);
 forming a pattern of openings through the opaque film to the substrate, by a first photolithographic process, (FIGS. 2C,2D);
 depositing a film of a phase shifter material over the opaque film and into the openings, (FIG. 2E);
 polishing the phase shifter material to an accurate thickness "T" selected along with the index of refraction of the phase shifter material to achieve a 180° phase shift, (FIG. 2F); and
 patterning the layer of phase shifter material with resist and selectively removing by etching the phase shifter material to provide a phase shifter in every other opening formed in the opaque film by the first photolithographic process (FIGS. 2G,2H).

This process forms a reticle having a repetitive pattern of phase shifters and light transmission openings having opaque light blockers on either side. This reticle may then be used in photopatterning a semiconductor wafer.

Referring now to FIG. 2A, a phase shift reticle fabricated in accordance with the invention is formed on a transparent substrate 20. In an illustrative embodiment of the invention the transparent substrate 20 is quartz (QZ). Quartz is a highly purified glass favored for its optical properties, inherent stability at high temperatures and its cleanliness. Quartz is typically utilized as the mask substrate material in optical projection systems and is highly transparent in the deep UV region. Alternately, the substrate 20 may be formed of any other transparent material having suitable optical and mechanical properties.

Next, and as shown in FIG. 2B, an opaque film 22 is deposited upon the quartz substrate 20. The opaque film 22 may be deposited onto the substrate 20 by conventional processes such as sputtering; chemical-vapor deposition (CVD), or electron beam deposition (EBD). In the illustrative embodiment, the opaque film 22 material is chromium (CR), which is typically utilized in such applications. Chromium (CR) is characterized by mechanical properties suitable for plating and is more than 90% opaque to wavelengths in the UV and deep UV region. Other opaque films however, such as iron oxide and aluminum would also be suitable for the application.

Next and as shown in FIG. 2C, a photosensitive layer of photo resist 24 is coated and patterned onto the opaque film 22 by techniques known in the art, such as with an E-beam writing or laser pattern writing. An etch and strip step may then be used to form a pattern of openings 26 through the opaque film 22 to the substrate 20, (FIG. 2D).

Next and as shown in FIG. 2E a phase shifter material 28 is blanket deposited over the opaque film 22 and into the openings 26. The phase shifter material 28 may be deposited by any conventional process such as evaporation, or chemical vapor deposition CVD. The phase shifter material 28 may be any transparent material that has an index of refraction with light that is different than the index of refraction for light with air. It is also preferable to utilize an inorganic material that is transparent in the UV and deep UV regions where most photolithographic processes are performed. This may, for example, be at a wavelength of about 248 nm for KrF excimer laser lithography. Photolithography may also be performed in the range of the UV i-line (365 nm) or the UV g-line (436 nm) which are also common wavelengths used in photolithographic processes.

A suitable phase shifter material 28 is ($SiO_2$) which is commonly used as the mask substrate material in semiconductor optical projection systems. Another suitable phase shifter material is silicon nitride ($SiN_x$). Other phase shifter materials would also be suitable in this application.

In the finished reticle the phase shifter material 28 preferably has a thickness "T" (FIG. 2F) that produces a 180° phase shift for light passing therethrough. This optimal thickness can be determined by the previously stated formula:

$$T = \frac{i\lambda}{2(n-1)}$$

where
T = thickness of phase shift material
i = an odd integer
λ = wavelength of exposure light
n = refractive index of phase shifter material at the exposure wavelength As an example, at an exposure wavelength of 365 nm (i-line), ($SiO_2$) has a refractive index of 1.48. This implies one optimal thickness "T" for achieving a 180° phase shift of T=3800Å.

One method of achieving the proper thickness "T" of the phase shifter material is by polishing the phase shifter material 28. Polishing of phase shifter material to the exact thickness "T" can be accomplished by chemical-mechanical polishing techniques which are known in the art. One such technique is known as chemical mechanical planarization (CMP). In general, chemical mechanical planarization involves holding or rotating a wafer of semiconductor material against a wetted polishing surface under controlled chemical, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. The procedure also removes surface imperfections and roughness to produce a more optically perfect surface suitable for the present application.

Such apparatus for polishing semiconductor wafers are disclosed in U.S. Pat. Nos. 4,193,226 and 4,811,522. Another such apparatus is manufactured by Westech Engineering and is designated as a Model 372 Polisher.

Next and as shown in FIGS. 2G and 2H, a second photolithographic process (photopattern, etch, and strip resist) may be used to remove all of the phase shifting material 28 except in every other opening 26 previously formed in the opaque film 22. This forms an alternating repetitive pattern of phase shifters 30 and light transmission openings 32 through the opaque film 22. Each phase shifter 30 and each light transmission opening 32 has an opaque light blocker 36 on either side.

As shown in FIG. 2G for forming the repetitive pattern of an opaque light blocker 36, a phase shifter 30, an opaque light blocker 36, and a light transmission opening 32, the phase shifter material 28 is coated with a patterned resist 34. A selective etch step is then performed to etch only the phase shifter material 28 and not the opaque film 22 or substrate 20. Such a selective etch would not affect the opaque light blockers 36 (i.e. CR) nor the quartz substrate 20 appreciably. The finished reticle is denoted by reference numeral 38 in FIG. 2H.

Figure 3:
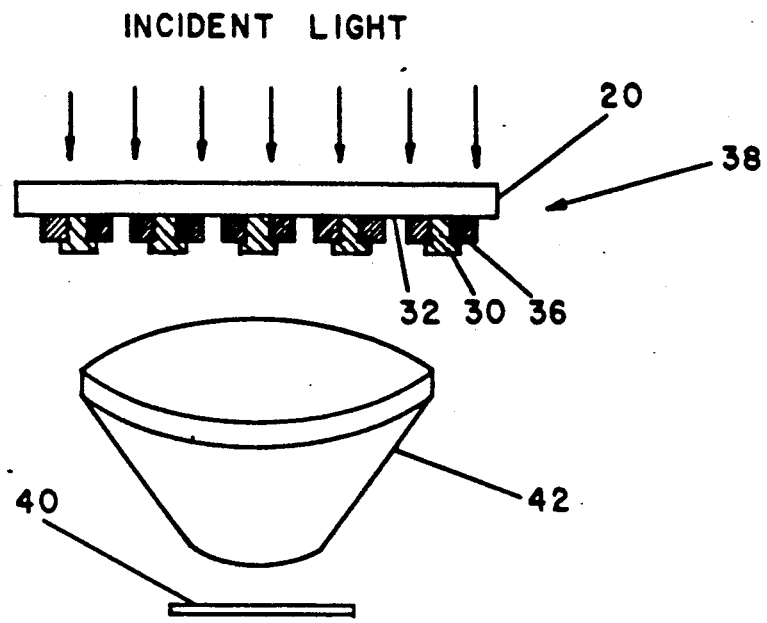
FIG. 3 is a diagrammatic representation of a phase shift reticle fabricated in accordance with the invention in use during phase shift photolithography of a semiconductor wafer.

Referring now to FIG. 3 a phase shift reticle 38 formed by the method of the invention is shown in use in a photolithographic process for photopatterning a semiconductor wafer 40. The phase shift reticle 38 is situated between the incoming incident light (i.e. KrF laser) and a wafer 40 to be processed. A reduction lens 42 is located between the phase shift reticle 38 and wafer 40. In an illustrative embodiment the reduction lens 42 is a 5× reduction system. Alternately other reduction systems such as 10×, 4×, or 1× may be utilized.

In the illustration of FIG. 3 a step and repeat system is utilized. In this system the wafer 40 is stepped under the lens 42 to expose the pattern in sections over the entire surface of the wafer 40. This is a typical application for a reticle 38 formed in accordance with the invention although other applications may also be possible including photopatterning of items other than semiconductor wafers.

Figure 4:
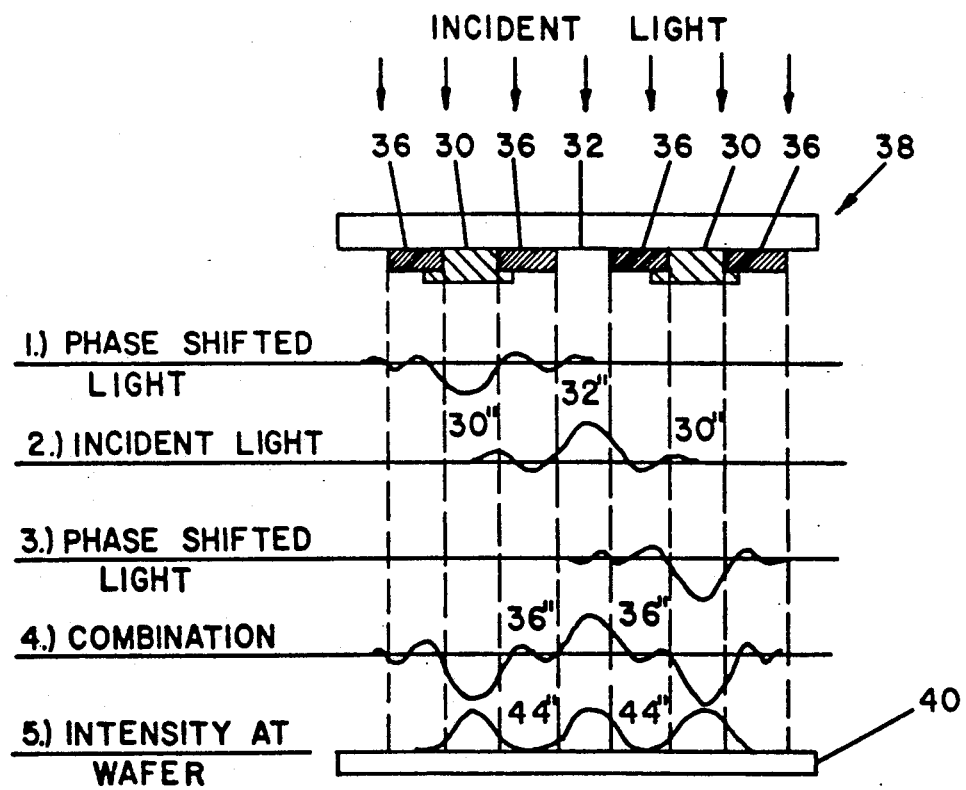
FIG. 4 is a diagrammatic representation showing the composition of light waves diffracted from phase shifters and from an adjacent light transmission opening on a reticle fabricated in accordance with the invention and the resulting amplitude and intensity of light waves at a target wafer.

Referring now to FIG. 4 an analysis of the composition of light waves diffracted from a light transmission opening 32 and adjacent phase shifters on either side of the light transmission opening is shown. Graph 1 denotes the amplitude and phase of phase shifted light (180°) passed through a first phase shifter 30 onto area 30' on the target wafer 40. Graph 2 denotes the amplitude and phase of incident light (no phase shift) passing through the light transmission opening 32' onto area 32' on the target wafer 40. Graph 3 denotes the amplitude and phase of phase shifted light (180°) passed through the phase shifter 30 on the other side of the light transmission opening 32. Graph 4 denotes the combined amplitude of the three light rays as seen at the object wafer 40. Graph 5 denotes the intensity of the light at the object wafer 40.

As seen in graphs 1,2, and 3 a light wave diffracted from either a phase shifter section 30, or a light transmission opening 32 of the reticle is naturally diffracted into areas 36' therebetween on the target wafer 40 in an area aligned with an opaque light blockers 36 on the reticle 38. As shown in graph 4, the combination of the three separate diffracted rays (graphs 1,2,3) in the areas 36' substantially cancel each other out so that these areas 36' are dark with clear cut boundaries. As shown in graph 5 this produces areas of approximately zero light intensity or dark areas 44' on the wafer 40. These dark areas 44' occur where diffracted light from the light aperture 32 would otherwise light the area. The resolution and depth of the feature is thus improved by the clearly delineated dark and light areas.

Thus the invention provides a simple yet unobvious method of fabricating phase shift reticles having an accurate phase shift layer and adapted for use in semiconductor photolithographic processes. While the process of the invention has been described with reference to a preferred embodiment thereof, as will be apparent to those skilled in the art, certain changes and modifications can be made without departing from the scope of the invention as defined by the following claims.

REFERENCES

[1] M.D. Levenson, D.S. Goodman, S. Lindsey, P.W. Barjer and H.A.E. Santini, "The Phase-Shifting Mask II: Imaging Simulations and Submicrometer Resist Exposures" IEEE Transactions on Electronic Devices, Vol. ED-31, No. 6, June 1984.

[2] T. Yamanaka, N. Hasegawa, T. Tanaka, K. Ishibashi, T. Hashimoto, A. Shimizu, N. Hashimoto, K. Sasaki, T. Nishida, and E. Takeda, "A 5.9 $\mu m^2$ Super Low Power SRAM Cell Using A New Phase Shift Lithography" IEDM Tech. Dig. pp. 477-480, 1990.

[3] A. Nitayama, T. Sato, K. Hashimoto, F. Shigemitsu, and M. Nakase, "New Phase Shifting Mask with Self-Aligned Phase Shifters for a Quarter Micron Photolithography" IEDM Tech. Dig. pp. 57-60, 1989.

[4] I. Hanyu, S. Asai, K. Kosemura, H. Ito, M. Nunokawa and M. Abe, "New Phase-Shifting Mask With Highly Transparent $SiO_2$ Phase Shifters" SPIE Vol. 1264 Optical/Laser Microlithography 111, P. 167-177, 1990.

What is claimed is:

1. A method of forming a phase shifting reticle for semiconductor manufacture comprising:

depositing an opaque material on a transparent substrate;

forming a repetitive pattern of openings through the opaque material to the substrate;

blanket depositing a phase shifter material over the opaque material and into the openings;

polishing and planarizing the phase shift material to a thickness "T"; and patterning the layer of phase shifter material and selectively etching the phase shifter material to provide a phase shifter in every other opening previously formed in the opaque material so that a repetitive pattern of phase shifters and light transmission openings having opaque light blockers on either side is formed on the substrate.

2. The method as recited in claim 1 and wherein:

the thickness "T" of the phase shifter material and index of refraction of the phase shifter material are selected to provide a phase shift of approximately 180°.

3. The method as recited in claim 1 further comprising:

directing an incident light through the reticle through a lens and onto a wafer to be photopatterned.

4. The method as recited in claim 1 and wherein:

the pattern of openings through the opaque material to the substrate is formed by a first photolithographic process.

5. A method of forming a phase shifting reticle for use in semiconductor photolithography comprising:

depositing an opaque material on a transparent substrate;

patterning by a first photolithography process a repetitive pattern of openings through the opaque material to the substrate with each opening having solid opaque sections on either side;

blanket depositing a phase shifter material over the solid opaque sections and into the openings with phase shifter material having a refractive index different than air;

polishing and planarizing the phase shifter material by chemical mechanical planarization (CMP) to a thickness "T" with the phase shifter material and thickness "T" selected for providing a 180° phase shift;

patterning by a second photolithography process and etching the phase shifter material to remove the phase shifter material except in every other opening formed in the opaque material wherein phase shifters are formed of a thickness "T";

whereby an repetitive pattern of alternating phase shifters and light transmission openings having light blockers on either side is formed.

6. The method as recited in claim 5 and wherein;

the transparent substrate is quartz.

7. The method as recited in claim 6 and wherein:

the opaque material is chromium (CR).

8. The method as recited in claim 7 and wherein:

the phase shifter material is ($SiO_2$).

9. A method of forming a phase shifting reticle for use in semiconductor photolithography comprising:
  depositing a film of opaque material on a transparent quartz substrate;
  photopatterning and etching the film of opaque material with a pattern of openings through the opaque material to the substrate by a first photolithography process;
  blanket depositing a phase shifter material into the openings;
  chemically mechanically planarizing (CMP) the phase shifter material to a thickness "T";
  coating the phase shifter material with a patterned resist and selectively removing the phase shifter material except in every other opening formed in the opaque material by an etch process selected to remove only the phase shifter material;
  whereby a phase shift reticle having a repetitive pattern of alternating light transmission openings and phase shifters separated by opaque light blockers is formed, with the thickness "T" and index of refraction of the phase shifters selected to provide a phase shift difference between light passed through the phase shifters and through the light transmission openings of about 180° such that diffracted light is substantially canceled in a dark area therebetween.

10. The method as recited in claim 9 and wherein: the thickness "T" is determined by the formula $$T = \frac{i\lambda}{2(n-1)}$$

where
  T = thickness of phase shift material
  i = an odd integer
  λ = wavelength of exposure light
  n = refractive index of phase shifter material at the exposure wavelength.

11. The method as recited in claim 10 and further comprising:
  directing an incident light through the phase shift reticle onto a target wafer in a photolithography process to produce alternating dark areas by diffraction of light waves between a light transmission opening and an adjacent phase shifter in order to improve the resolution and depth of the photolithography process.

12. The method as recited in claim 10 and wherein: the substrate is quartz, the opaque material is chromium (CR), and the phase shifter material is ($SiO_2$).

13. The method as recited in claim 10 and wherein: thickness "T" = 3800Å.

14. A method of forming a phase shifting reticle for use in semiconductor photolithography comprising:
  depositing an opaque material on a transparent substrate;
  depositing a photosensitive resist onto the opaque material, patterning the resist, and etching a pattern of first openings into the opaque material;
  blanket depositing ($SiO_2$) as a phase shifter material over the opaque material and into the openings;
  chemically mechanically planarizing (CMP) the ($SiO_2$) to a thickness of "T" to produce a phase shift of about 180°;
  depositing a photosensitive resist onto the phase shifter material patterning the resist and selectively etching away the phase shifter material except in every other opening, whereby a repetitive pattern is formed on the substrate including an opaque light blocker, a light transmission opening, a light blocker, and a phase shifter;
  whereby incident light may be directed through the substrate and light diffracted through a phase shifter section will be canceled by light diffracted through a light transmission opening to form a dark area therebetween for improving a resolution of an image on a target wafer to be photopatterned.

15. The method as recited in claim 14 and wherein: a 5× reduction lens is placed between the reticle and a wafer to be photopatterned.

16. The method as recited in claim 14 and wherein: the etch process to selectively etch the phase shifter material has no appreciable effect on the opaque layer or mask substrate.

* * * * *